(12) United States Patent
Donath et al.

(10) Patent No.: US 12,540,725 B2
(45) Date of Patent: Feb. 3, 2026

(54) LUMINAIRE ASSEMBLY AND METHOD OF MANUFACTURING A LUMINAIRE ASSEMBLY

(71) Applicant: DELO Industrie Klebstoffe GmbH & Co. KGaA, Windach (DE)

(72) Inventors: Tobias Donath, Windach (DE); Tobias Fränkel, Windach (DE)

(73) Assignee: DELO INDUSTRIE KLEBSTOFFE GmbH & Co., Windach (DE)

( * ) Notice: Subject to any disclaimer, the term of this patent is extended or adjusted under 35 U.S.C. 154(b) by 0 days.

(21) Appl. No.: 18/709,597

(22) PCT Filed: Nov. 11, 2022

(86) PCT No.: PCT/EP2022/081665
§ 371 (c)(1),
(2) Date: May 13, 2024

(87) PCT Pub. No.: WO2023/094183
PCT Pub. Date: Jun. 1, 2023

(65) Prior Publication Data
US 2025/0027636 A1    Jan. 23, 2025

(30) Foreign Application Priority Data
Nov. 26, 2021  (DE) ...................... 10 2021 131 126.8

(51) Int. Cl.
*F21V 23/00*       (2015.01)
*F21V 29/56*       (2015.01)
(Continued)

(52) U.S. Cl.
CPC .......... *F21V 23/001* (2013.01); *F21V 23/006* (2013.01); *F21V 29/56* (2015.01);
(Continued)

(58) Field of Classification Search
CPC ...... F21V 23/001; F21V 23/006; F21V 29/56; F21V 29/60; F21V 29/763; F21Y 2105/16
See application file for complete search history.

(56) References Cited

U.S. PATENT DOCUMENTS 5,907,475 A * 5/1999 Babinski ............... H05K 1/14
                                                        363/141
7,005,584 B2 * 2/2006 Levi .................... H05K 1/14
                                                        174/254
(Continued)

FOREIGN PATENT DOCUMENTS

DE     202006000380 U1    2/2007
DE     102015120490 A1    6/2017
(Continued)

*Primary Examiner* — Tsion Tumebo
(74) *Attorney, Agent, or Firm* — McNees Wallace & Nurick

(57) ABSTRACT

A luminaire assembly includes a first electronic assembly on which at least one light-emitting unit and an electrical contact point are arranged. A cooling element is in contact with the first electronic assembly by an intermaterial bond and/or in a positive manner. The luminaire assembly further includes at least one second electronic assembly having an electrical contacting, wherein an electrical connection is provided between the electrical contact point of the first electronic assembly and the electrical contacting of the second electronic assembly for actuating the at least one light-emitting unit. The electrical contacting is arranged on an end face of the second electronic assembly, wherein the surface of the end face and a radiating face of the at least one light-emitting unit of the first electronic assembly-enclose an angle (β) from 90° to 270°. Furthermore, a method of manufacturing a luminaire assembly is disclosed.

10 Claims, 7 Drawing Sheets

(51) Int. Cl.
*F21V 29/60* (2015.01)
*F21V 29/76* (2015.01)
*F21Y 105/16* (2016.01)

(52) U.S. Cl.
CPC ............ *F21V 29/60* (2015.01); *F21V 29/763* (2015.01); *F21Y 2105/16* (2016.08)

(56) References Cited

U.S. PATENT DOCUMENTS

| | | | |
|---|---|---|---|
| 9,887,183 B2* | 2/2018 | Wang | ................ H01L 23/49833 |
| 10,865,978 B2 | 12/2020 | Engelmann | |
| 11,022,255 B2 | 6/2021 | Novak | |
| 2005/0158687 A1* | 7/2005 | Dahm | ..................... F28D 15/02 |
| | | | 433/29 |
| 2012/0170261 A1 | 7/2012 | Hu et al. | |
| 2013/0114251 A1 | 5/2013 | Duan | |
| 2015/0211721 A1* | 7/2015 | Mornet | ................ B60Q 1/0094 |
| | | | 362/546 |
| 2016/0023093 A1 | 1/2016 | Nieves et al. | |
| 2018/0313527 A1 | 11/2018 | Engelmann | |
| 2019/0032859 A1 | 1/2019 | Novak | |
| 2021/0131646 A1 | 5/2021 | Monestier et al. | |

FOREIGN PATENT DOCUMENTS

| | | |
|---|---|---|
| DE | 102017116924 A1 | 1/2019 |
| WO | 199853651 A1 | 11/1998 |
| WO | 2019105639 A1 | 6/2019 |

\* cited by examiner

LUMINAIRE ASSEMBLY AND METHOD OF MANUFACTURING A LUMINAIRE ASSEMBLY

FIELD OF DISCLOSURE

The present disclosure relates to a luminaire assembly and to a method of manufacturing a luminaire assembly.

BACKGROUND

Luminaires can be used in many different ways. They not only serve for lighting purposes, but can also be used in industrial plants, for example for curing adhesives, coatings, paints or other (curable) masses. It is desirable that these luminaires or luminaire assemblies comprising these luminaires have a small installation space with simultaneously high intensities and sufficiently good heat dissipation.

Conventional luminaires, in particular for curing curable materials, comprise an electronic assembly consisting of light-emitting units, for example LEDs, which are arranged on a printed circuit board. This printed circuit board can be an IMS board ("IMS" for "Insulated Metal Substrate"), which dissipates the heat generated during operation of the light-emitting unit to a cooling element via its metal core. An electrical connection must be established to ensure contact with the remaining electronics, such as a temperature sensor. This either leads to a further electronic assembly or is established via a plug connection on the same electronic assembly to the remaining electronics.

Document WO 98/53651 A1 discloses a connection between two or more electronic assemblies. For this purpose, a backplane is provided with recesses at non-electrically conductive points and adjacent solder contact points. One or more printed circuit boards having corresponding pins and solder contact points can be inserted into these recesses and then permanently electrically contacted with each other via a soldered connection.

The disadvantage of this approach is that the substrate must be heated to the process temperature of the solder during soldering at the soldering point, which can damage or even destroy the substrate or a component pre-mounted thereon. In addition, a large installation space is required for soldered connections. Furthermore, direct contacting of the electronic components is not possible.

Lamps or luminaires the electronic assemblies of which are electrically contacted with each other via a plug connection are also known in the prior art. Here, the light-emitting units are arranged on an upper side of a two-layer IMS board. A two-layer structure means that a dielectric coating is present on both an upper side and a bottom side of the highly heat-dissipating metal core. Conductor tracks with corrosion-protecting solder resist are arranged on the dielectric coatings. For an electrical through-connection, i.e. an electrical connection from a first board to a further board, a hole is provided through the two-layer IMS board, and then the hole is filled with resin for electrical insulation from the copper core and the resin is hardened. A bore with the desired reduced diameter is again drilled through the hardened resin and coated with copper on the insides. The plug connection is passed through the bore and soldered in a planar manner to the copper surface, creating an electrical through-connection. On the bottom side of the two-layer IMS board, the conductor tracks with the solder resist and the dielectric are completely or at least partially removed by deep milling so that the metal core can lie free and in direct contact with the cooling element. The heat generated by the light-emitting units can thus be dissipated directly and to a sufficient extent.

The disadvantage of this approach, however, is that a plug connection takes up a lot of space, two-layer IMS boards are very expensive, and the assembly of the entire lamp with many process steps is very complex.

A further lamp or luminaire structure provides only one electronic assembly. This is realized by using a single-layer IMS board. Single-layer means that a dielectric layer on which conductor tracks with a corrosion-protecting solder resist are located is only applied to the upper side of the highly heat-dissipating metal core. The single-layer IMS circuit board is divided into three areas, namely a luminous surface area, a bending area and a wall area. The light-emitting units are arranged on the upper side of the luminous surface area. On the bottom side of the bending area, a section of the metal core is removed by deep milling down to a necessary layer thickness. The bending area of the single-layer IMS board is bent using a mechanical bending device so that the luminous surface area and the wall area are aligned at an angle of 90° to each other. The cooling element is arranged in direct contact with the metal core so that the heat generated by the light-emitting elements can be sufficiently dissipated.

The disadvantage of this approach is that a minimum bending radius is required for bending, which can vary depending on the structure of the IMS board and requires more installation space. For different luminaire types and structures, it is necessary to re-evaluate the radius, angle, dielectric and base material of the IMS board each time in a complex process and to design an individual mechanical bending device.

SUMMARY

The present disclosure is based on the object of at least partially overcoming the described disadvantages in the prior art and providing a cost-effective, compact, flexibly designed luminaire assembly with high light intensities and at the same time good heat dissipation. In particular, the luminaire assembly should be easy to repair. Furthermore, the luminaire assembly should be particularly suitable for being able to be lined up in several directions with other luminaire assemblies.

According to the present disclosure, the object is achieved by a luminaire assembly comprising a first electronic assembly on which at least one light-emitting unit and an electrical contact point are arranged. A cooling element is in contact with the first electronic assembly by an intermaterial bond and/or in a positive manner. In addition, the luminaire assembly comprises at least one second electronic assembly having an electrical contacting, wherein an electrical connection is provided between the electrical contact point of the first electronic assembly and the electrical contacting of the second electronic assembly for actuating the at least one light-emitting unit. The electrical contacting is arranged on an end face of the second electronic assembly, wherein the surface of the end face and a radiating face of the at least one light-emitting unit of the first electronic assembly enclose an angle in the range from 90° to 270°.

In particular, the angle between the surface of the end face and the radiating face denotes the angle between the plane in which the surface of the end face lies and the plane in which the radiating face lies.

In other words, the first electronic assembly and the second electronic assembly can also be spaced apart from each other as long as the angle between the surface of the end face and the radiating face of the at least one light-emitting unit is in the range from 90° to 270°. The corresponding angle is thus provided between the respective planes in which the surface of the end face and the radiating face of the at least one light-emitting unit of the first electronic assembly lie.

The first electronic assembly and/or the second electronic assembly is in particular plate-shaped. For example, the first electronic assembly and/or the second electronic assembly has a printed circuit board.

In this respect, the end face of the second electronic assembly denotes a side of the second electronic assembly which is smaller in at least one direction of extension than an upper and/or bottom side of the second electronic assembly which is (substantially) perpendicular to the upper or bottom side.

The luminaire assembly according to the present disclosure is characterized in particular by a small space requirement and thus a compact design.

At the same time, the heat generated during operation of the at least one light-emitting unit can be effectively dissipated via the cooling element, so that thermal damage to the luminaire assembly can be prevented and the service life of the luminaire assembly can be increased.

The at least one light-emitting unit and the electrical contact point of the first electronic assembly are electrically connected to each other. Thus, the at least one light-emitting unit can be supplied with a voltage and an associated current and controlled via the electrical connection between the first and the second electronic assembly.

The first electronic assembly may have a substrate and/or an electronic carrier material which is made up of several layers. For example, the first electronic assembly comprises a thermally conductive layer, a non-electrically but thermally conductive layer and electrically conductive structures.

The thermally conductive layer may be made of a heat-conducting base material.

The heat-conducting base material is, for example, copper, aluminum or a technical ceramic and has in particular a high (three-dimensional) thermal conductivity of >0.5 W/mK and a low thermal resistance, also referred to as RTH, so that the heat generated by the at least one light-emitting unit arranged on the first electronic assembly can be dissipated in an optimum manner.

The non-electrically but thermally conductive layer is also referred to as a dielectric layer. The dielectric layer, preferably based on epoxies, ceramics or a glass ceramic, transports heat but has an electrically insulating effect.

If the heat-conducting base material or the thermally conductive layer is not simultaneously also electrically conductive, the dielectric layer can be dispensed with as no electrical insulation is required.

The electrically conductive structures are characterized in particular in that the surface thereof is suitable for a downstream wire bonding process, for example Au, Ag, Al or Cu wire bonding, and selectively consists of copper, gold, palladium, nickel, silver, aluminum or mixtures thereof. These materials or metals are usually used in combination with each other, but can also be used in their pure form.

The electrical contact point of the first electronic assembly belongs, in particular, to the electrically conductive structures of the first electronic assembly.

Optionally, the first electronic assembly can additionally comprise a solder resist. Due to its non-wettability with the solder material, the solder resist prevents the applied solder material from melting, which would result in undesired electrical through-connections. The solder material is therefore held in a designated area by the solder resist. The solder resist also serves as corrosion protection in the presence of base metals.

If a ceramic is used in the dielectric layer, the use of a solder resist may be dispensed with, as the surface properties of ceramics already ensure that any solder material applied does not melt or at least reduces this.

The second electronic assembly may also have a substrate and/or an electronic carrier material which is made up of several layers. For example, the second electronic assembly comprises a non-electrically conductive layer and electrically conductive structures.

Examples of suitable substrates and/or electronic carrier materials for the second electronic assembly are FR3, FR4, Rogers, rigid-flex and multilayer boards.

The electrical contacting of the second electronic assembly belongs in particular to the electrically conductive structures of the second electronic assembly.

To design the required installation space of the luminaire assembly particularly small, the light-emitting unit and the associated electrical contact point can be arranged together on a radiating face of the first electronic assembly, the radiating face and the end face of the second electronic assembly being substantially parallel to each other.

The term "substantially parallel to each other" means that the radiating face and the end face of the second electronic assembly are parallel to each other, apart from unavoidable deviations, for example a slight tilting during the manufacture of the luminaire assembly.

It is also possible for the radiating face and the end face of the second electronic assembly to be parallel to each other, but not in the same plane. In other words, the radiating face of the first electronic assembly and the end face of the second electronic assembly can be arranged offset to each other, for example at different heights.

In a specific embodiment, the radiating face and the end face of the second electronic assembly can lie in a common plane. In this respect, in one variant, the radiating face of the first electronic assembly and the end face of the second electronic assembly lie in a common plane.

The radiating face of the at least one light-emitting unit is in particular parallel to the radiating face of the first electronic assembly. In particular, the radiating face of the at least one light-emitting unit defines the radiating face of the first electronic assembly on which the light-emitting unit is arranged.

In other words, the same statements apply to the radiating face of the at least one light-emitting unit as described above for the radiating face of the first electronic assembly.

For example, the radiating face of the at least one light-emitting unit may be parallel to the end face of the second electronic assembly, wherein the radiating face and the end face can also be arranged offset to each other. Alternatively, the radiating face of the at least one light-emitting unit can also lie in a common plane with the end face of the second electronic assembly.

Basically, the end face of the second electronic assembly is preferably arranged in spatial proximity to the electrical contact points of the first electronic assembly, so that the electrical connection can be established in a space-saving and simple manner, for example via bonding wires.

In a preferred embodiment, the second electronic assembly is adjacent to a side face of the first electronic assembly. In this way, the electrical connection can be designed to be particularly short, so that the manufacturing costs are reduced, the current carrying capacity is increased, the size of the luminaire assembly can be further reduced and thus the ability to be lined up can be optimized.

In particular, one edge of the end face of the second electronic assembly adjoins the first electronic assembly, preferably the side face of the first electronic assembly.

Basically, it is also possible to provide two or more second electronic assemblies, which in particular adjoin one or more side faces of the first electronic assembly, so that a flexible design of the luminaire assembly and an optimum configuration of the electrical connection is made possible.

In one variant, the first electronic assembly has an opening to which the second electronic assembly is assigned, in particular wherein the second electronic assembly is arranged at an edge area of the opening. In this way, it is possible to realize a particularly compact design of the luminaire assembly.

The electrical contact point and/or the electrical contacting can consist of copper, gold, palladium, nickel, silver, aluminum or mixtures thereof. Such materials provide reliable electrical contacting and a sufficiently high current carrying capacity.

In particular, the electrical contact point and/or the electrical contacting are suitable for a downstream wire bonding process, for example Au, Ag, Al or Cu wire bonding.

The electrical connection has in particular a current-carrying capacity of at least 0.5 A so that the at least one light-emitting unit can be reliably supplied with the necessary operating current.

The electrical connection can be realized by a wire connection made of gold, aluminum, silver or copper, for example.

Depending on the material, such wire connections have a diameter in the range of 10 μm to 500 μm.

The at least one light-emitting unit is preferably an LED. LEDs have low energy requirements and a high luminous efficacy and are thus particularly energy-efficient.

For electrical and thermal contacting of the at least one light-emitting unit, the latter is in particular soldered to the electrically conductive structures of the first electronic assembly.

It is also possible to electrically contact the at least one light-emitting unit using bond pads.

The light generated by the at least one light-emitting unit comprises light of one or more wavelengths. Preferably, the peak range, i.e. the peak wavelength(s), lies in the spectrum of the light generated by the at least one light-emitting unit, in the UV-A, UV-B, UV-C, FIR, IR or in the visible range. In other words, the maximum intensity of the generated light is in said spectrum.

The wavelength is particularly adapted to the intended use of the luminaire assembly.

Preferably, the at least one light-emitting unit emits light with a wavelength in the range from 200 nm to 1000 nm, in particular light with a peak wavelength of 365 nm, 400 nm and/or 460 nm. In other words, the maximum intensity of the light is at the specified wavelength or in the specified range. Such wavelengths are particularly suitable for curing curable materials such as adhesives, paints, potting and/or coating materials.

A plurality of light-emitting units are in particular provided to achieve a desired illuminance. For example, the multiple light-emitting units are arranged at a maximum distance of 1 mm from each other. The light-emitting units can be positioned in a row or optionally in the form of a cross or a circle. A symmetrical arrangement is particularly preferred.

More than one light-emitting unit may be present to enable a high light intensity with a compact design of the luminaire assembly, two or more of the light-emitting units being connected in series and/or parallel in the electrical sense to form a string. The string of several light-emitting units is electrically contacted by means of the associated electrical contact point.

In other words, several light-emitting units combined in a circuit are referred to as a string. In such a string, the current load can be evenly distributed.

In one variant, the light-emitting units of a string emit light of the same wavelength(s). In this way, a high illuminance with a corresponding light spectrum is achieved.

The string comprising several light-emitting units also ensures that, compared to a single light-emitting unit, more extensive and homogeneous illumination in terms of illuminance is possible.

In another variant, a plurality of strings is used on the first electronic assembly, which emit light of different wavelengths, in particular different peak wavelengths. Such a combination also makes it possible to use mixed wavelengths.

The number of light-emitting units in the string depends in particular on the desired illuminance. For example, at least two light-emitting units are connected in series to form a string.

Within a string, the electrical connection between the light-emitting units involved can be made via at least one bonding wire and/or at least one soldered connection.

For electrical contacting of the entire string, the first light-emitting unit of the string and the last light-emitting unit of the string are each connected to the associated electrical contacting of the second electronic assembly, in particular via at least one bonding wire.

Several strings may also be provided, each comprising more than one light-emitting unit. Thus, the luminaire assembly according to the present disclosure can provide the light-emitting units used in the sense of an array of strings.

For example, six strings each having twelve light-emitting units are provided, i.e. a total of 72 light-emitting units, to achieve a desired illuminance with correspondingly planar illumination.

The individual strings may have the same or different designs. For example, at least one of the strings includes light-emitting units with a different emission spectrum.

Preferably, the individual strings are arranged interchangeably within the luminaire assembly. In this way, defective strings can be easily replaced, and the repair costs can thus be reduced. In addition, a flexible adaptation to the intended purpose of application is possible by replacing individual or all strings with strings having a different number and/or type of light-emitting units.

To dissipate the heat generated by the at least one light-emitting unit, a cooling element is provided according to the present disclosure. For an ideal transport of the heat, the cooling element is in contact with the first electronic assembly by an intermaterial bond and/or in a positive manner.

Usually, the maximum operating temperature of the at least one light-emitting unit is up to 150° C. The heat generated at this operating temperature can be reliably dissipated by the cooling element, so that the luminaire assembly may have a particularly long service life, in particular a service life of at least 20,000 operating hours.

The cooling element may be a (completely) passive cooling element, i.e. the heat is only removed from the first electronic assembly by heat conduction through the cooling element.

Materials which can be used for the cooling element are for example copper, tin-plated copper, copper with a nickel alloy, pure silicon carbide, technical silicon carbide, silicon nitride, aluminum, aluminum nitride, aluminum oxide and mixtures thereof. These materials have a very high thermal spreading ability and conductivity in common. In particular, the heat conductivity of these materials is >20 W/mK, as shown in Table 1 for some examples.

TABLE 1

Thermal conductivities of materials for the cooling element.

| Material | Thermal conductivity in W/mK |
|---|---|
| copper | 401 |
| pure silicon carbide | 350 |
| aluminum | 237 |
| aluminum nitride | 180 |
| technical silicon carbide | 100-140 |
| silicon nitride | 100 |
| aluminum oxide | 30 |

The cooling element is in particular dimensioned such that it independently provides sufficient thermal mass for the intended application of the luminaire assembly.

In one variant, the cooling element comprises a heat-conducting receptacle in which the first electronic assembly is received. The heat generated in the first electronic assembly can be easily transported away therefrom and, optionally, a mechanical fixing and/or alignment of the first electronic assembly can simultaneously be achieved using the heat-conducting receptacle.

In a further variant, the luminaire assembly comprises a housing which forms a component part of the cooling element. In this variant, the cooling element is in particular configured in several pieces and comprises the heat-conducting receptacle, the housing contacting the receptacle in a heat-conducting manner. In this way, the heat generated during operation of the first electronic assembly can be quickly dissipated by means of the receptacle and transferred to the housing, via which the heat can then be released to the surroundings of the luminaire assembly. In this respect, the housing serves to dissipate heat, which is why it is part of the cooling element.

The housing also performs a protective function for the components of the luminaire assembly. For example, the housing comprises a frame holder and a protective glass mounted in the frame holder, the protective glass being arranged in front of the at least one light-emitting unit in the direction of radiation thereof. In this case, the protective glass must be permeable or at least partially permeable to light of the wavelength(s) generated by the at least one light-emitting unit.

To further reduce the required installation space, the cooling element can be attached to the second electronic assembly by an intermaterial bond, in a non-positive or in a positive manner. For this purpose, the second electronic assembly can be attached to the cooling element by means of a screw connection and/or an alignment pin. In this way, the relative alignment of the first and second electronic assemblies to each other is simultaneously ensured and secured, which increases the resistance of the luminaire assembly to mechanical loads, for example vibrations.

In a further embodiment, an active cooling system can additionally be present, which is in contact with the cooling element for heat exchange.

An active cooling system is understood to be a cooling system in which a medium flowing past, for example a fluid such as a gas or a liquid, absorbs heat by means of convection or flow transport to cool the at least one light-emitting unit.

Suitable media for the active cooling system may be cooling liquids such as water, glycol or mixtures thereof. Air or a process gas for cooling, such as argon, is also conceivable.

Active cooling systems also include Peltier elements, which are electrothermal converters which generate a temperature difference based on the Peltier effect when current flows therethrough.

The active cooling system serves to increase the maximum amount of heat which can be dissipated per unit of time. The active cooling system is therefore particularly advantageous if CW operation (CW for continuous wave) is desired instead of only pulsed operation of the at least one light-emitting unit.

In particular, the active cooling system is attached in a non-destructive and detachable manner to the remaining components of the luminaire assembly, for example to the housing, so that a flexible adaptation to the respective conditions required during operation of the luminaire assembly is possible in a simple manner, in particular during operation.

Furthermore, in addition to the at least one light-emitting unit, further electronic components for converting physical variables into electrical variables, such as a thermocouple or a photosensitive component, may also be arranged on the first electronic assembly.

A thermocouple ensures that the luminaire assembly automatically readjusts or switches off automatically if too high temperatures are achieved, i.e. if the temperature of the luminaire assembly or the at least one light-emitting unit exceeds a predetermined temperature threshold.

A photosensitive component, for example a diode, monitors the output of the luminaire assembly and ensures constant irradiation.

The luminaire assembly can also include further electronic assemblies which are in electrical contact with the first and/or second electronic assembly. For example, a third electronic assembly is provided, which has a controller for the luminaire assembly or is designed as such.

The further electronic assemblies may also be used for signal processing, for example to amplify an electrical signal and/or to achieve a desired signal-to-noise ratio.

The object of the present disclosure is further achieved by a method of manufacturing a luminaire assembly. A first electronic assembly is provided, on which at least one light-emitting unit and an electrical contact point, which is assigned to the at least one light-emitting unit, are arranged. The first electronic assembly is contacted with a cooling element, so that a contact by an intermaterial bond and/or a positive contact is produced. Furthermore, at least one second electronic assembly having an electrical contacting arranged on an end face of the second electronic assembly is provided. The first electronic assembly and the second electronic assembly are arranged relative to each other such that the surface of the end face, on which the electrical contacting is provided, and a radiating face of the at least one light-emitting unit enclose an angle in the range from 90° to 270°. An electrical connection is established between the electrical contact point of the first electronic assembly and the electrical contacting of the second electronic assembly.

A luminaire assembly as described above can in particular be manufactured using the method according to the present disclosure.

BRIEF DESCRIPTION OF THE DRAWINGS

Further advantages and features of the invention will become apparent from the description below and from the drawings, to which reference is made and in which.

DETAILED DESCRIPTION

Figure 1:
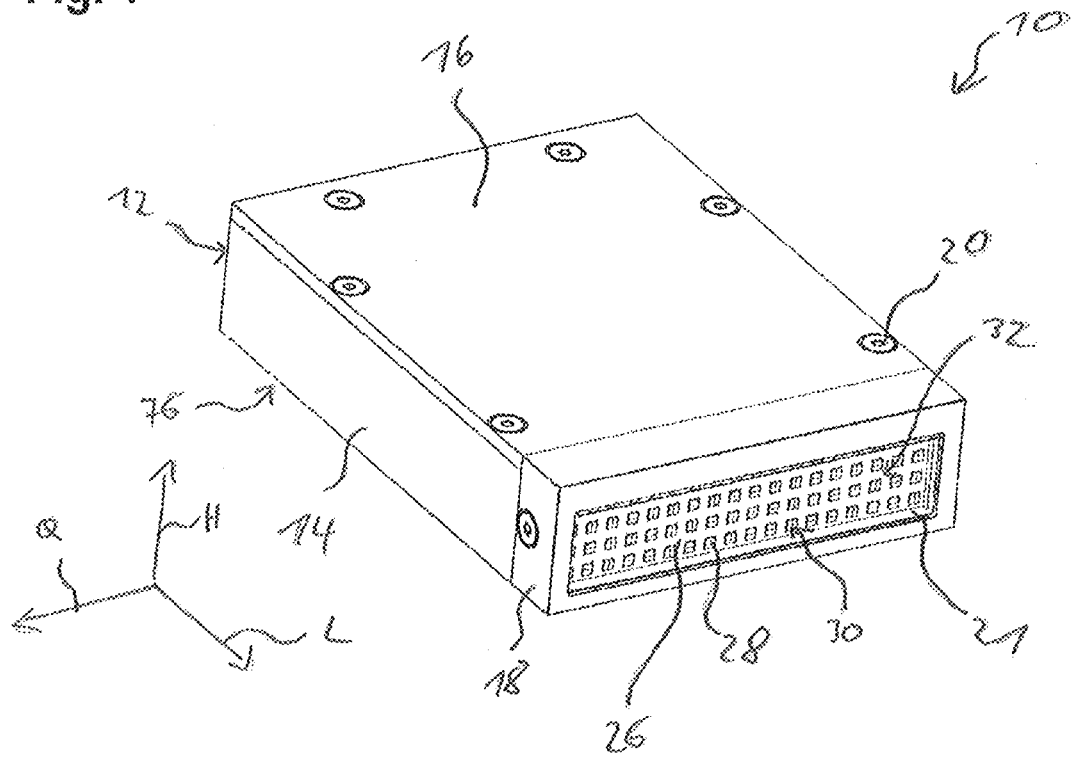
FIG. 1 shows a perspective view of a luminaire assembly according to an example embodiment.

FIG. 1 shows a luminaire assembly 10 according to a first embodiment of the present disclosure. The luminaire assembly 10 is suitable for use in a manufacturing system and can be used for curing light-curing masses such as adhesives, paints, potting and/or coating materials.

In this respect, the luminaire assembly 10 can also be referred to as a curing luminaire.

The luminaire assembly 10 comprises a housing 12, which has a housing body 14, a housing cover 16 formed separately therefrom, and a frame holder 18.

The housing cover 16 closes the housing body 14 by fastening it by means of screws 20 to an upper side 22 of the housing body 14, in which suitable countersunk bores 24 are provided for receiving the screws 20. Corresponding openings are provided in the housing cover 16, through which the screws 20 extend to engage with the countersunk bores 24.

The frame holder 18 can at least partially surround both the housing cover 16 and the housing body 14 simultaneously in the assembled position, wherein the frame holder 18 has been pushed onto or placed on the end side onto the pre-assembled unit, which comprises the housing body 14 and the housing cover 16. Alternatively, the frame holder 18 adjoins corresponding edges of the housing cover 16 and the housing body 14 via edges.

In addition, the frame holder 18 serves to receive a glass plate 21, which covers a first electronic assembly 26 having a plurality of light-emitting units 28 and protects it from external environmental influences, in particular from soiling and/or mechanical damage.

The glass plate 21 is at least partially transparent to light emitted by the light-emitting units 28 and, as explained above, has a protective function with respect to a radiating face 30 of the light-emitting units 28 or a radiating face 32 of the first electronic assembly 26.

Figure 2:
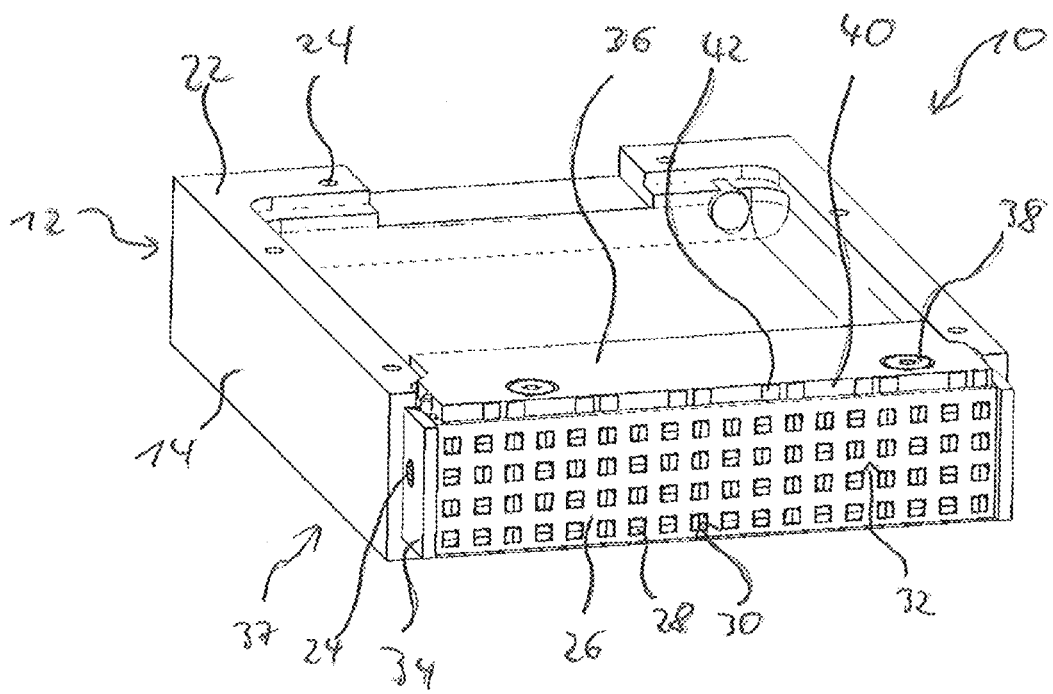
FIG. 2 shows a perspective view of the luminaire assembly from FIG. 1 without housing cover, frame holder and glass plate.

FIG. 2 shows a perspective view of the luminaire assembly 10 without the housing cover 16, without the frame holder 18 and without the glass plate 21.

In this illustration, it is apparent that the first electronic assembly 26 is held in a heat-conducting receptacle 34 to dissipate the heat generated by the light-emitting units 28 during operation in a first step by heat conduction. The heat-conducting receptacle 34 is shown in more detail in FIG. 4, to which reference will be made below.

The receptacle 34 is made, for example, of copper, tin-plated copper, copper with a nickel alloy, pure silicon carbide, technical silicon carbide, silicon nitride, aluminum, aluminum nitride, aluminum oxide or a mixture thereof, which ensures correspondingly good heat conduction.

The receptacle 34 is also in heat-conducting contact with the housing 12, in particular via the housing body 14.

The housing body 14 is also of a conductive heat-conducting nature, so that the heat absorbed by the receptacle 34 is dissipated in a further step to the housing body 14 and emitted by the latter to the outside, i.e. to the surroundings. Good heat conduction from the first electronic assembly 26 to the surroundings is thus ensured, namely via the heat-conducting receptacle 34, in which the first electronic assembly 26 is accommodated, and the housing body 14, which is connected to the heat-conducting receptacle 34.

The heat-conducting receptacle 34 and the housing body 14 thus lead to a passive, conductive heat dissipation and together form a cooling element 37 for the first electronic assembly 26.

The receptacle 34 also has its own countersunk bores 24 for fastening the frame holder 18 to the receptacle 34 by means of screws 20.

A second electronic assembly 36 is arranged at an angle of 90° to the first electronic assembly 26 and is fastened to the heat-conducting receptacle 34 by means of an internal screw connection 38.

It is apparent from FIG. 2 that both electronic assemblies 26 and 36 are substantially plate-shaped, the two plate-shaped electronic assemblies 26 and 36 being substantially perpendicular to each other.

A plurality of electrical contacts 42, which serve to establish an electrical connection 70 between the first electronic assembly 26 and the second electronic assembly 36 (see FIG. 8) are located on an end face 40 of the second electronic assembly 36, which will be discussed below.

Figure 3:
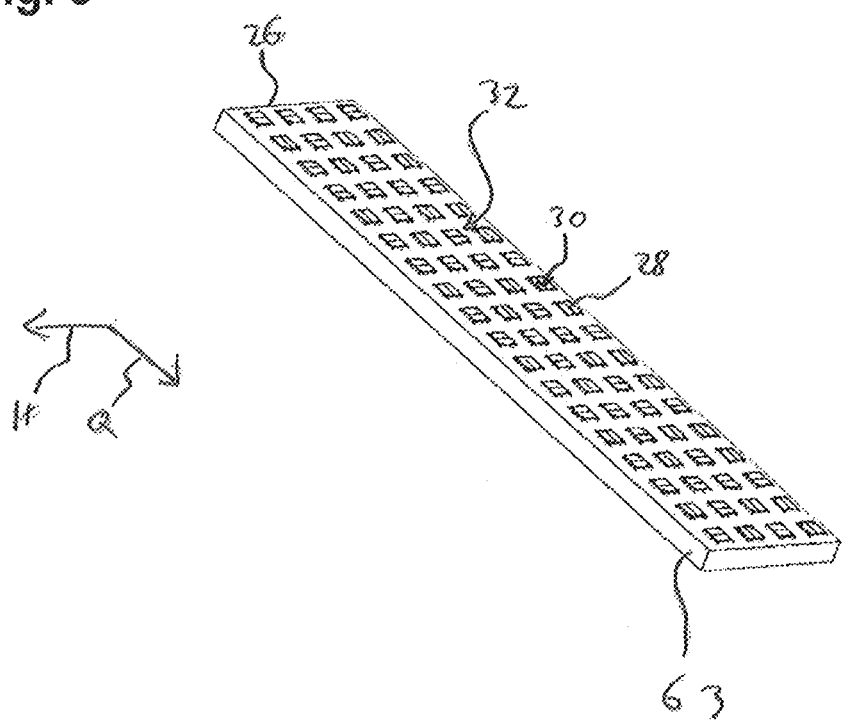
FIG. 3 shows a first electronic assembly of the luminaire assembly from FIG. 1, on which light-emitting units are arranged.

FIG. 3 shows a perspective representation of the first electronic assembly 26, which has a plurality of light-emitting units 28 on its radiating face 32. The radiating face 32 of the first electronic assembly 26 is defined by the light-emitting units 28, in particular the radiating faces 30 thereof.

It is understood that more or fewer light-emitting units 28 than shown in FIG. 3 may be provided. The exact number and arrangement of the light-emitting units 28 depends in particular on the desired illuminance and/or illuminating area of the luminaire assembly 10.

The light-emitting units 28 are LEDs which generate light in the UV-A, UV-B, UV-C, FIR, IR or visible range, the light-emitting units 28 being adapted to generate light of the same wavelength or light of different wavelengths.

The light generated by the light-emitting units 28 is emitted from the radiating face 30, which in the embodiment shown is (substantially) parallel to the radiating face 32 of the first electronic assembly 26. Due to manufacturing tolerances, it is possible that the radiating face 30 is (slightly) tilted relative to the radiating face 32 of the first electronic assembly 26, i.e. by a few degrees, in particular less than 5 degrees.

Figure 4:
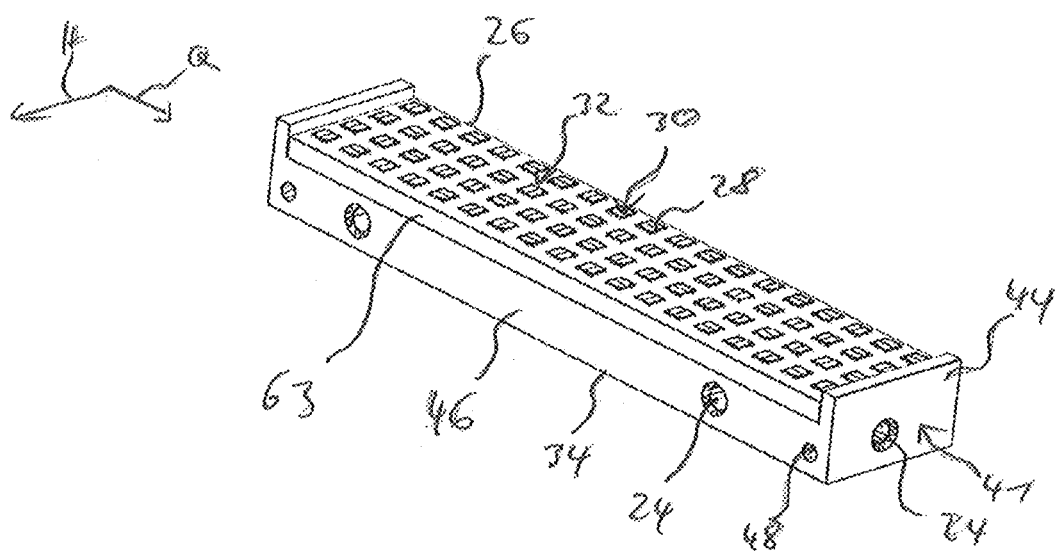
FIG. 4 shows the first electronic assembly from FIG. 3 in a heat-conducting receptacle.

As can be seen in FIG. 4, the first electronic assembly 26 is held in the heat-conducting receptacle by an intermaterial bond and in a positive manner.

The first electronic assembly 26 can be fastened in the receptacle 34 by means of a soldered connection. In this way, the heat-conducting receptacle 34 serves to increase the heat spread and thus a heat dissipation of the light-emitting units 28 over a larger area.

In addition, the receptacle 34 has projections 44 which secure the first electronic assembly 26 along a transverse direction Q.

In FIG. 4 it can also be seen that the receptacle 34 has openings 48 on a side face 46, which is perpendicular to the radiating face 32, and further countersunk bores 24, the function of which will be discussed below with reference to FIG. 7.

Figure 5:
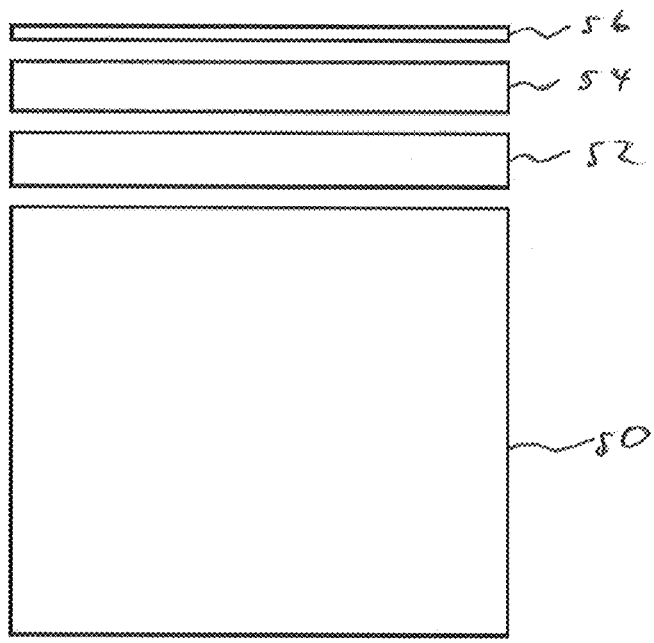
FIG. 5 shows a schematic representation of a layered structure of the first electronic assembly from FIG. 3.

FIG. 5 schematically shows a layer structure of the first electronic assembly 26.

A non-electrically but thermally conductive layer 52 which is also referred to as a dielectric layer is applied onto a thermally conductive layer 50, which serves to dissipate heat and is therefore also referred to as a heat-conducting base material.

Electrically conductive structures 54 which are at least partially covered by a solder resist 56 are located on the dielectric layer 52.

The light-emitting units 28 (see FIG. 3) are electrically contacted with the electrically conductive structures 54, for example via a soldered connection.

The thermally conductive layer 50 is in heat-conducting contact with the receptacle 34 to dissipate the heat generated by the light-emitting units 28.

Figure 6:
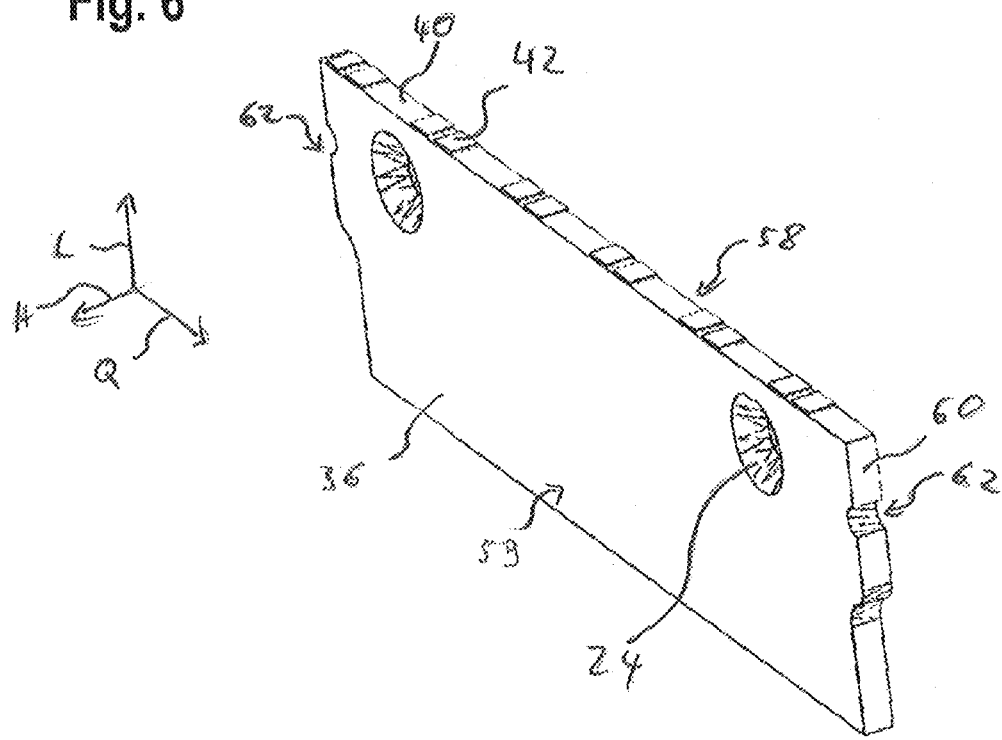
FIG. 6 shows a second electronic assembly of the luminaire assembly from FIG. 1 with an electrical contacting on one end face.

FIG. 6 shows the second electronic assembly 36, on the end face 40 of which the electrical contacts 42 are located.

The end face 40 is a narrow side of the plate-shaped or board-shaped second electronic assembly 36, that is, the end face 40 is smaller along an upward direction H than an upper side 58 and a bottom side 59 along a longitudinal direction L and the transverse direction Q.

The second electronic assembly 36 also has countersunk bores 24 for an internal screw connection 38 (see FIG. 2), which are not visible from the outside when the luminaire assembly 10 is finally mounted, as they are concealed by the housing 12.

In addition, the second electronic assembly 36 has a positioning recess 62 on at least one side face 60, in particular two positioning recesses 62 on opposite side faces 60. The side faces 60 also extend in the upward direction H like the end face 40, the side faces 60 laterally adjoining the end face 40.

In other words, the two side faces 60 and the end face 40 together constitute three of the four short sides of the plate-shaped second electronic assembly 36, which also has the upper side and the bottom side, which are the main faces of the plate.

Figure 7:
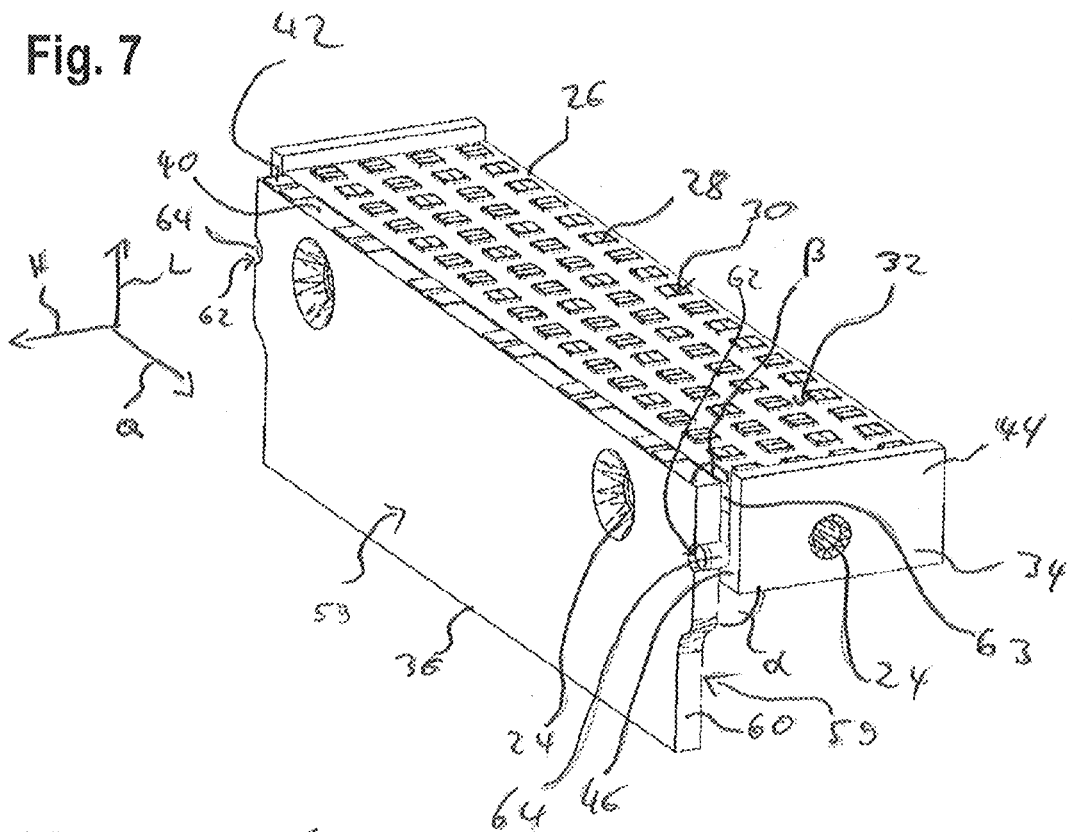
FIG. 7 shows a perspective representation of the first electronic assembly from FIG. 4 and the second electronic assembly from FIG. 6.

FIG. 7 shows the arrangement of the first electronic assembly 26 relative to the second electronic assembly 36, wherein in the illustrated embodiment, the second electronic assembly 36 rests on a side face 63 of the first electronic assembly 26, so that the radiating face 32 of the first electronic assembly 26 and the end face 40 of the second electronic assembly 36 lie together in one plane.

As can be seen, the first electronic assembly 26 and the second electronic assembly 36 are oriented substantially perpendicular to each other. This means that the main planes of the two electronic assemblies 26 and 36 enclose an angle α of 90° to each other.

In other words, the radiating face 32 of the first electronic assembly 26 and the side face 40 of the second electronic assembly 36 form an angle β of 180° with respect to each other, since they lie in a common plane.

In other words, the radiating face 32 of the first electronic assembly 26, and also the radiating face 30 of the light-emitting units 28, is parallel to the end face 40 of the second electronic assembly 36, resulting in a particularly compact arrangement of the two electronic assemblies 26 and 36.

It is understood that the radiating face 32 of the first electronic assembly 26 and the side face 40 of the second electronic assembly 36 do not necessarily have to lie in a common plane. For example, the second electronic assembly 36 can be arranged offset in the longitudinal direction L, for example offset downwards in the perspective view of FIG. 7.

Furthermore, it can be seen in FIG. 7 that the second electronic assembly 36 is arrested by means of two, in particular cylindrical, alignment pins 64, which are each associated with one of the positioning recesses 62.

The alignment pins 64 are mounted at one axial end in the recesses 48 of the receptacle 34, engage with their other axial end in the respective positioning recess 62 and thus align the second electronic assembly 36 in a mounting position in which the countersunk bores 24 of the second electronic assembly 36 are brought into alignment with the countersunk bores 24 on the side face 46 of the receptacle 34 (cf. FIG. 4) to enable fastening of the second electronic assembly 36 to the receptacle 34 by means of the internal screw connection 38 (cf. FIG. 2).

Alternatively, it may also be provided that the receptacle 34 has studs instead of the positioning recesses 62, the studs serving to position the second electronic assembly 36 in relation to the receptacle 34 or the first electronic assembly 26 held therein.

Figure 8:
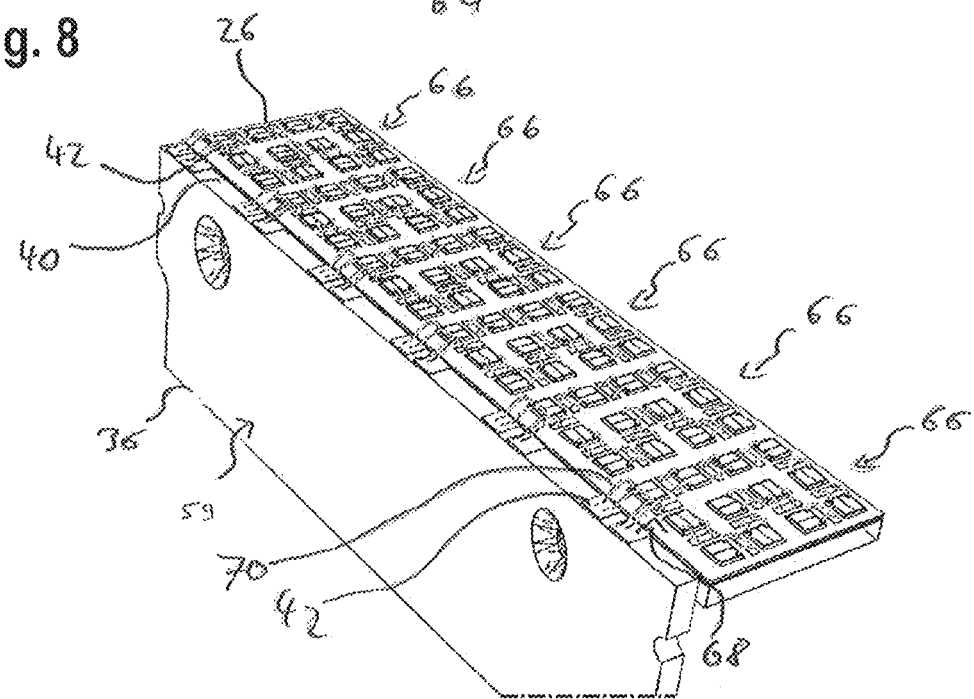
FIG. 8 shows a perspective representation of FIG. 7 with an electrical connection drawn, but without heat-conducting receptacle.

FIG. 8 shows the interconnection of the first electronic assembly 26 and the second electronic assembly 36, which was omitted in FIGS. 1 to 7 merely for the sake of clarity.

It can be seen that the light-emitting units 28 are combined into a total of six strings 66, each including twelve light-emitting units 28.

It is understood that the number of strings 66 and the number of light-emitting units 28 per string 66 can be varied, depending on the desired application profile of the luminaire assembly 10.

Each string 66 has an electrical contact point 68, which is assigned to the first or the last of the light-emitting units 28 in the respective string 66, and which is connected to the electrical contacting 42 of the second electronic assembly 36 by means of an electrical connection 70.

The electrical connection 70 is a wire connection made of gold, aluminum, silver or copper and has a current carrying capacity of at least 100 mA.

In particular, the electrical connection 70 is designed such that it can compensate for thermal movements. For this purpose, the wire connection can have at least one curved section.

Figure 9:
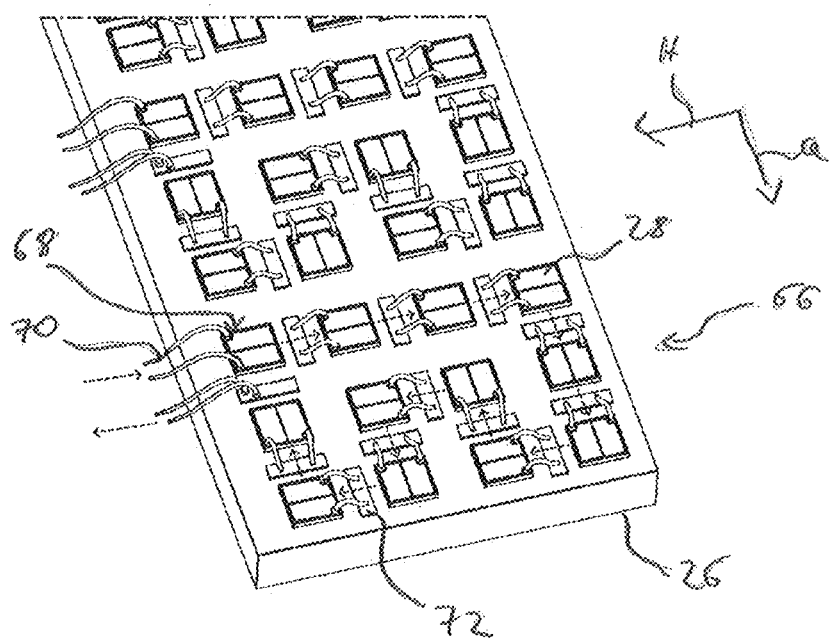
FIG. 9 shows an enlarged perspective representation of the first electrical assembly from FIG. 3, in which the electrical contactings become clear.

FIG. 9 shows an enlarged view of the structure and contacting of a string 66 of light-emitting units 28.

In this view, it becomes even clearer that the light-emitting units 28 of the string 66 are connected in series via bonding wires, as indicated by arrows.

Each of the light-emitting units 28 is further in electrical contact with an associated bond pad 72, which is part of the electrically conductive structures 54 of the first electronic assembly 26 (cf. FIG. 5).

In other words, each of the light-emitting units 28 has a first pole formed by soldering surfaces and a second pole formed by the associated bond pad 72 by means of the bonding wires.

Each light-emitting unit 28 is electrically conductively connected to the first pole of a subsequent light-emitting unit 28 in the string 66 via bonding wire connections of the second pole.

For example, the first pole is the anode and the second pole is the cathode.

The respective first and last light-emitting unit 28 of a string 66 are brought into direct electrical contact with the electrical contacting 42 of the second electronic assembly 36 by means of the electrical connection 70 (cf. FIG. 8).

Figure 10:
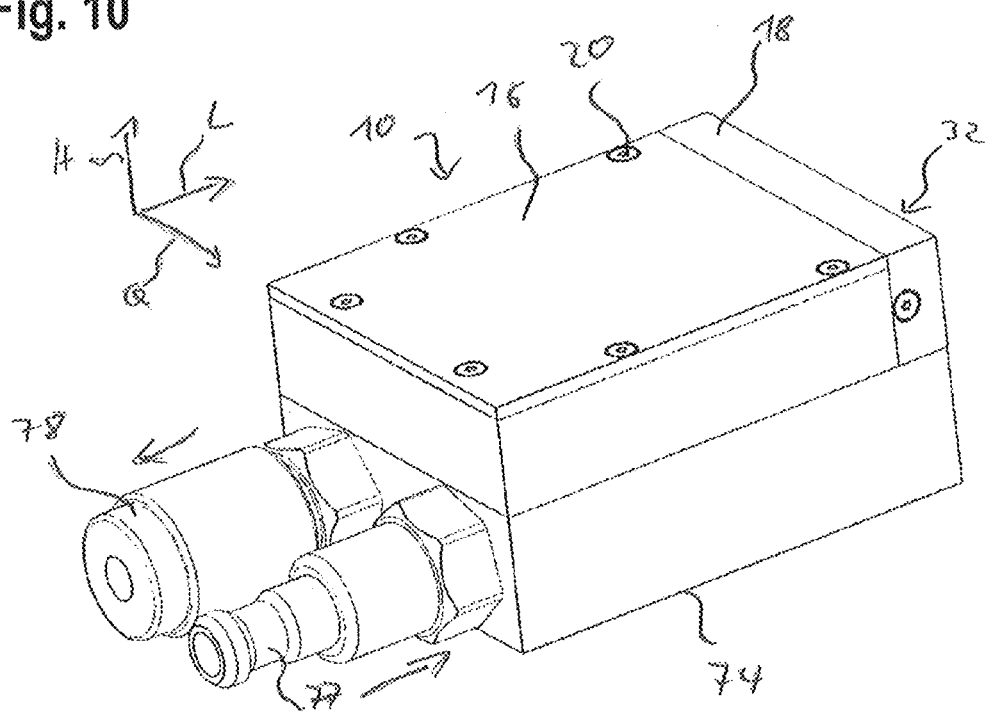
FIG. 10 shows a perspective view of the luminaire assembly from FIG. 1 with an additional active cooling.

As can be seen in FIG. 10, the luminaire assembly 10 can optionally be provided with an active cooling system 74.

In the embodiment shown, it is attached to a bottom side 76 of the housing body 14 (cf. FIG. 1) and is supplied with a cooling medium via an inlet 77, the cooling medium being discharged again via an outlet 78, as indicated by arrows in FIG. 10.

Cooling media such as water, glycol or mixtures thereof can be used as a cooling medium. Air or a process gas, for example argon, is also conceivable as a cooling medium.

In the following, a method according to the present disclosure of manufacturing a luminaire assembly 10 as described above is explained.

Figure 11:
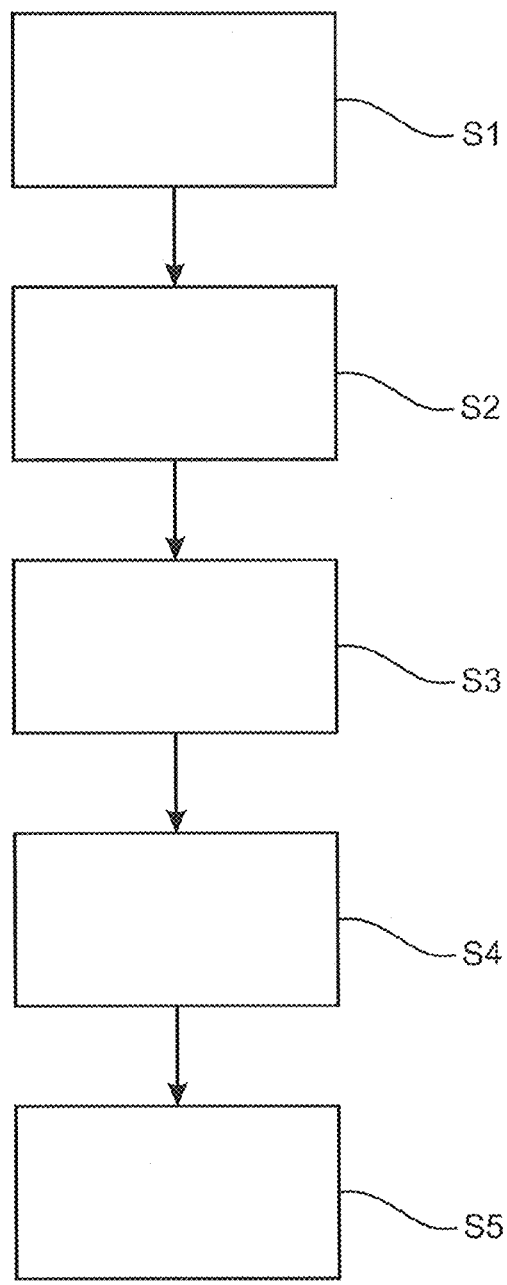
FIG. 11 shows a block diagram of a method according to an example embodiment of manufacturing the luminaire assembly according to FIG. 1.

First, the first electronic assembly 26 is provided, on which the at least one light-emitting unit 28 and the electrical contact point 68 assigned to the at least one light-emitting unit 28 are arranged (step S1 in FIG. 11).

The first electronic assembly 26 is contacted with the cooling element 37, in particular with the receptacle 34, so that contacting by an intermaterial bond and/or a positive contacting is established (step S2 in FIG. 11).

In addition, the at least one second electronic assembly 36 is provided with the electrical contacting 42, which is arranged on the end face 40 of the second electronic assembly 36 (step S3 in FIG. 11).

The first electronic assembly 26 and the second electronic assembly 36 are arranged relative to each other such that the surface of the end face 40, on which the electrical contacting 42 is provided, and a radiating face 30 of the at least one light-emitting unit 28 of the first electronic assembly 26 enclose an angle β in the range from 90° to 270° (step S4 in FIG. 11). This results in the relative orientation of the two electronic assemblies 26 and 36 to each other as shown in FIG. 7.

Previously, the alignment pins 64 may have been inserted into the associated recesses 48 of the receptacle 34 to facilitate the orientation of the second electronic assembly 36 with respect to the receptacle 34 or the first electronic assembly 26. Furthermore, the second electronic assembly 36 may be secured to the receptacle 34 via the internal screw connection 38.

An electrical connection 70 is also established between the electrical contact point 68 of the first electronic assembly 26 and the electrical contacting 42 of the second electronic assembly 36 (step S5 in FIG. 11). For this purpose, the wiring 70 shown in FIG. 8 is established.

The housing 12 can then be placed around the unit consisting of the two electrically connected assemblies 26 and 36. For this purpose, the housing body 14 can be slipped thereon or attached thereto. Finally, the housing cover 16 can be fastened to the housing body 14, and the frame holder 18 can be attached to the receptacle 34 to obtain the luminaire assembly 10 shown in FIG. 1.

Figure 12:
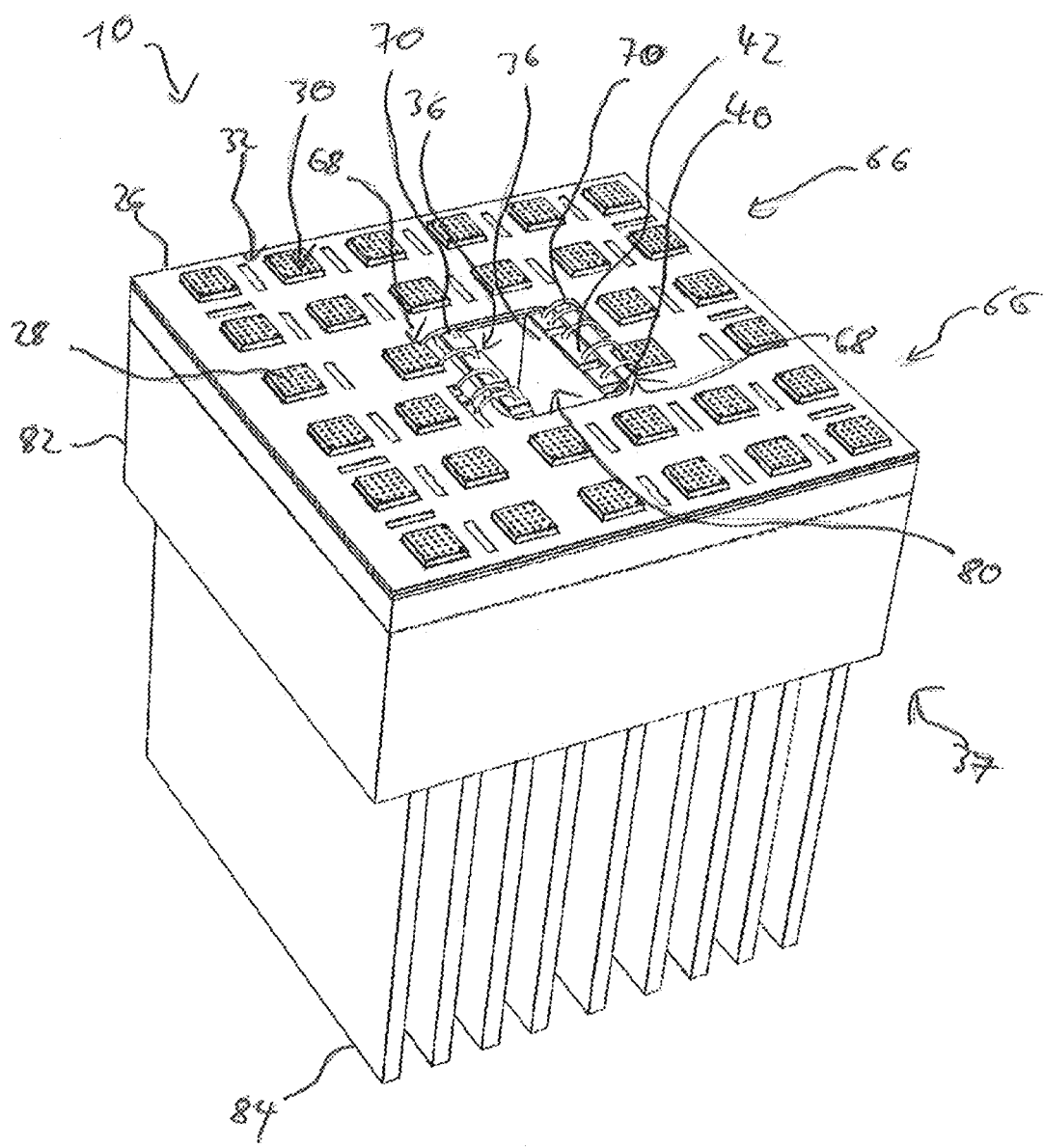
FIG. 12 shows a perspective view of selected parts of a further embodiment of the luminaire assembly according to an example embodiment.

FIG. 12 shows selected components of a further embodiment of the luminaire assembly 10.

The further embodiment substantially corresponds to the previously explained embodiments, so that only the differences will be discussed below. Identical reference signs indicate identical components and reference is made to the explanations above.

In the embodiment shown in FIG. 12, the first electronic assembly 26 has a square, centrally arranged opening 80, which is designed as a kind of aperture.

Two second electronic assemblies 36, which are arranged opposite each other are assigned to the opening 80, in particular the edge area of the opening 80. The two second electronic assemblies 36 are in contact with the first electronic assembly 26 by means of electrical connections 70, the electrical connections 70 being made between the electrical contactings 42 of the second electronic assemblies 36 and the associated electrical contact points 68 of the first electronic assembly 26.

To optimize heat dissipation, the cooling element 37 in this embodiment comprises a cooling block 82 and adjoining cooling fins 84 connected by an intermaterial bond to the first electronic assembly 26.

The luminaire assembly 10 according to the present disclosure is characterized by a particularly compact design, a flexible layout, optimized ability to be lined up, and improved heat management compared to the luminaires known from the prior art.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A luminaire assembly, comprising:
    a first electronic assembly on which at least one light-emitting unit and an electrical contact point associated with the at least one light-emitting unit are arranged,
    a cooling element which is in contact with the first electronic assembly by at least one of an intermaterial bond or in a positive manner, the cooling element including a thermally conductive receptacle, in which the first electronic assembly is accommodated, wherein the receptacle has projections which secure the first electronic assembly along a transverse direction,
    a housing which is a component of the cooling element, the housing contacting the receptacle in a heat-conducting manner, at least one second electronic assembly having an electrical contacting, wherein an electrical connection is provided between the electrical contact point of the first electronic assembly and the electrical contacting of the second electronic assembly for actuating the at least one light-emitting unit, wherein the electrical connection is realized by a wire connection, wherein the first electronic assembly and the second electronic assembly both have a printed circuit board which are plate-shaped, wherein the light-emitting unit and the associated electrical contact point are arranged together on a radiating face of the first electronic assembly, wherein the at least one electrical contacting is arranged on an end face of the second electronic assembly, wherein the surface of the end face of the second electronic assembly, on which the at least one electrical contacting is arranged, and the radiating face of the at least one light-emitting unit of the first electronic assembly, on which the light-emitting unit and the associated electrical contact point are arranged, are parallel to each other such that the at least one electrical contacting and the electrical contact point are pointing towards the same direction, wherein the housing comprises a housing body and a frame holder that is connected to the receptacle and at least partially surrounds the housing body in an assembled position, wherein the housing encompasses the first electronic assembly and the second electronic assembly, wherein the frame holder at least partly encompasses the first electronic assembly and the second electronic assembly, and wherein the luminaire assembly is capable of curing adhesives, coatings, paints or other curable masses.

2. The luminaire assembly according to claim 1, wherein the radiating face and the end face of the second electronic assembly lie in a common plane.

3. The luminaire assembly according to claim 1, wherein the second electronic assembly adjoins a side face of the first electronic assembly.

4. The luminaire assembly according to claim 1, wherein the first electronic assembly has an opening to which the second electronic assembly is assigned, in particular wherein the second electronic assembly is arranged at an edge area of the opening.

5. The luminaire assembly according to claim 1, wherein the electrical connection has a current carrying capacity of at least 100 mA.

6. The luminaire assembly according to claim 1, wherein more than one light-emitting unit is provided and two or more of the light-emitting units are connected at least one of in series or in parallel to form a string, wherein the string is electrically contacted via the associated electrical contact point.

7. The luminaire assembly according to claim 1, wherein the cooling element is fastened to the second electronic assembly by an intermaterial bond, in at least one of a non-positive or in a positive manner.

8. The luminaire assembly according to claim 1, wherein an active cooling system is additionally provided, which is in contact with the cooling element for heat exchange.

9. A method of manufacturing a luminaire assembly for curing adhesives, coatings, paints or other curable masses, the method comprising:

providing a first electronic assembly, on which at least one light-emitting unit and an electrical contact point associated with the at least one light-emitting unit are arranged, wherein the light-emitting unit and the associated electrical contact point are arranged together on a radiating face of the first electronic assembly, wherein the first electronic assembly comprises a thermally conductive layer that is made of a heat-conducting base material, contacting the first electronic assembly with a cooling element, so that a contact by at least one of an intermaterial bond or a positive contact is produced, providing at least one second electronic assembly having an electrical contacting arranged on an end face of the second electronic assembly, wherein the second electronic assembly has a printed circuit board which is plate-shaped, arranging the first electronic assembly and the second electronic assembly relative to each other such that the surface of the end face of the second electronic assembly, on which the electrical contacting is provided, and the radiating face of the at least one light-emitting unit of the first electronic assembly, on which the light-emitting unit and the associated electrical contact point are arranged, enclose an angle ($\beta$) in the range from 90° to 270°, wherein the end face of the second electronic assembly denotes a side of the second electronic assembly which is smaller in at least one direction of extension than an upper side or a bottom side of the second electronic assembly and which is perpendicular to the upper side or the bottom side establishing an electrical connection between the electrical contact point of the first electronic assembly and the electrical contacting of the second electronic assembly, wherein the electrical connection is realized by a bonding wire, providing a housing which is a component of the cooling element, the housing encompassing the first electronic assembly and the second electronic assembly, wherein the housing comprises a housing body and a frame holder, and pushing the frame holder onto the housing body or placing the frame holder on an end side of the housing during the assembling such that the frame holder at least partly encompasses the first electronic assembly and the second electronic assembly in an assembled state.

10. A luminaire assembly, comprising a first electronic assembly on which at least one light-emitting unit and an electrical contact point associated with the at least one light-emitting unit are arranged, a cooling element which is in contact with the first electronic assembly by at least one of an intermaterial bond or in a positive manner, a housing which is a component of the cooling element, at least one second electronic assembly having an electrical contacting, wherein an electrical connection is provided between the electrical contact point of the first electronic assembly and the electrical contacting of the second electronic assembly for actuating the at least one light-emitting unit, wherein the first electronic assembly and the second electronic assembly both have a printed circuit board which are plate-shaped, wherein the at least one electrical contacting is arranged on an end face of the second electronic assembly, wherein the surface of the end face and a radiating face of the at least one light-emitting unit of the first electronic assembly enclose an angle in the range from 90° to 270°, wherein the end face of the second electronic assembly denotes a side of the second electronic assembly which is smaller in at least one direction of extension than an upper side or a bottom side of the second electronic assembly and which is perpendicular to the upper side or the bottom side, wherein the electrical connection is realized by at least one bonding wire, wherein the light-emitting unit and the associated electrical contact point are arranged together on a radiating face of the first electronic assembly, wherein the housing encompasses the first electronic assembly and the second electronic assembly, and wherein the luminaire assembly is capable of curing adhesives, coatings, paints or other curable masses.

* * * * *